United States Patent
Chang et al.

(10) Patent No.: US 7,203,563 B2
(45) Date of Patent: Apr. 10, 2007

(54) AUTOMATIC N2 PURGE SYSTEM FOR 300 MM FULL AUTOMATION FAB

(75) Inventors: Ko-Pin Chang, Tainan (TW); Jui-An Shih, Kaohsiung (TW); Hui-Tang Liu, Yongkang (TW); Simon Chang, Pingzhen (TW); Nain-Sung Lee, Shin Chu (TW); Yung-Chang Peng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/821,156

(22) Filed: Apr. 8, 2004

(65) Prior Publication Data

US 2005/0228530 A1 Oct. 13, 2005

(51) Int. Cl.
*G06F 19/00* (2006.01)

(52) U.S. Cl. ....................... 700/121; 700/112

(58) Field of Classification Search ............. 700/95, 700/96, 99–102, 112, 113, 115–121; 438/14–18, 438/106–127, 905–909
See application file for complete search history.

(56) References Cited

U.S. PATENT DOCUMENTS

| | | | | |
|---|---|---|---|---|
| 5,241,851 A * | 9/1993 | Tapp et al. | ................. | 73/29.01 |
| 5,295,522 A * | 3/1994 | DeAngelis et al. | ............ | 141/98 |
| 5,428,555 A * | 6/1995 | Starkey et al. | ............... | 700/275 |
| 5,746,008 A * | 5/1998 | Yamashita et al. | ............. | 34/211 |
| 5,871,805 A * | 2/1999 | Lemelson | ....................... | 427/8 |
| 6,074,443 A * | 6/2000 | Venkatesh et al. | .......... | 29/25.01 |
| 6,120,371 A * | 9/2000 | Roberson et al. | ........... | 454/187 |
| 6,224,638 B1 * | 5/2001 | Jevtic et al. | ................ | 29/25.01 |
| 6,297,114 B1 * | 10/2001 | Iwata et al. | .................. | 438/305 |
| 6,444,137 B1 * | 9/2002 | Collins et al. | ................. | 216/79 |
| 6,451,118 B1 * | 9/2002 | Garriga | ....................... | 118/715 |
| 6,519,498 B1 * | 2/2003 | Jevtic et al. | ................. | 700/101 |
| 6,575,687 B2 * | 6/2003 | Bonora et al. | .............. | 414/217 |
| 6,583,509 B2 * | 6/2003 | Nulman | ....................... | 257/773 |
| 6,597,964 B1 * | 7/2003 | Huang et al. | ................ | 700/121 |
| 6,672,864 B2 * | 1/2004 | Wang et al. | ................... | 432/5 |
| 6,678,570 B1 * | 1/2004 | Pasadyn et al. | ............. | 700/121 |
| 6,696,367 B1 * | 2/2004 | Aggarwal et al. | ........... | 438/758 |
| 6,762,821 B2 * | 7/2004 | Kamono | ....................... | 355/30 |
| 6,772,805 B2 * | 8/2004 | Tsai et al. | ....................... | 141/98 |
| 6,803,996 B2 * | 10/2004 | Kamono | ....................... | 355/75 |
| 6,821,891 B2 * | 11/2004 | Chen et al. | ................. | 438/687 |
| 6,833,903 B2 * | 12/2004 | Kamono | ....................... | 355/30 |
| 6,852,012 B2 * | 2/2005 | Vepa et al. | .................... | 451/41 |
| 6,867,153 B2 * | 3/2005 | Tokunaga | .................... | 438/800 |
| 6,916,397 B2 * | 7/2005 | Pfeiffer et al. | .......... | 156/345.26 |
| 6,966,967 B2 * | 11/2005 | Curry et al. | ............ | 156/345.26 |
| 2001/0027082 A1 * | 10/2001 | Vepa et al. | .................... | 451/41 |
| 2002/0164242 A1 * | 11/2002 | Wehrung et al. | ............ | 414/935 |
| 2003/0019839 A1 * | 1/2003 | Yamamoto et al. | ........... | 216/60 |
| 2003/0136512 A1 * | 7/2003 | Yamamoto | ............. | 156/345.26 |
| 2004/0003777 A1 * | 1/2004 | Carpenter et al. | ........... | 118/715 |
| 2004/0025786 A1 * | 2/2004 | Kontani et al. | ............. | 118/715 |
| 2004/0083961 A1 * | 5/2004 | Basceri | ....................... | 118/715 |
| 2004/0091341 A1 * | 5/2004 | Blattner et al. | ........ | 414/331.01 |

(Continued)

FOREIGN PATENT DOCUMENTS

JP 07058047 A * 3/1995

*Primary Examiner*—Maria N. Von Buhr
(74) *Attorney, Agent, or Firm*—Haynes and Boone, LLP

(57) ABSTRACT

A system for manufacturing semiconductor integrated circuit (IC) devices, including an operating control system, a process intermediate station in communication with the operating control system, and a gas purge device, wherein the gas purge device is included in the process intermediate station.

27 Claims, 5 Drawing Sheets

U.S. PATENT DOCUMENTS

2004/0168765 A1* 9/2004 Matsumoto ............... 156/345.3
2005/0009325 A1* 1/2005 Chung et al. ............... 438/637
2005/0077204 A1* 4/2005 Sumi et al. ................. 206/710
2005/0105991 A1* 5/2005 Hofmeister et al. ........ 414/217

* cited by examiner

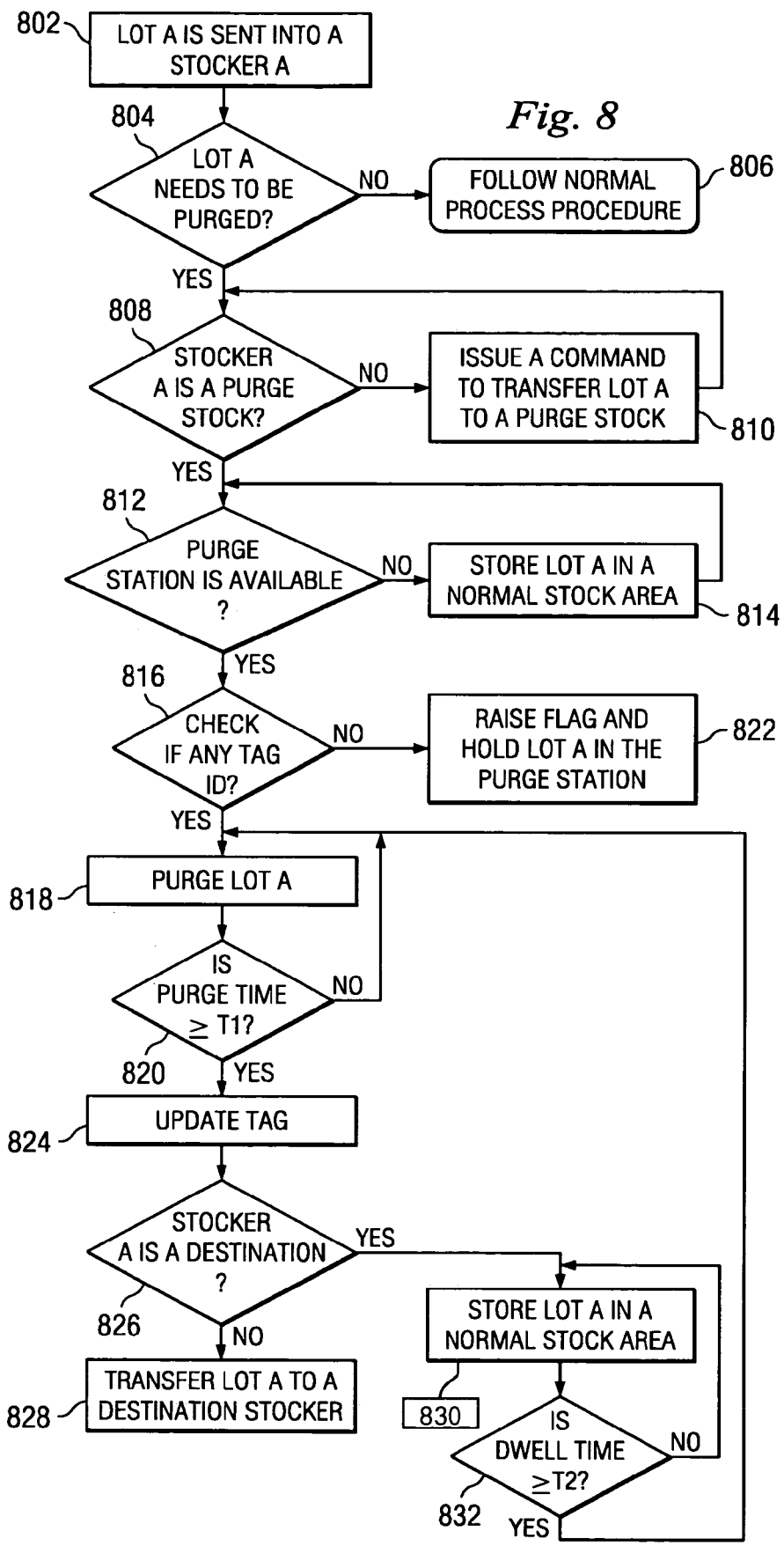

AUTOMATIC N2 PURGE SYSTEM FOR 300 MM FULL AUTOMATION FAB

BACKGROUND

The present disclosure relates generally to the field of semiconductor manufacturing and, more particularly, to a system and method for N2 purge.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and equipments are needed.

Furthermore, as the IC industry has matured, various operations to produce an IC may be performed at different locations by a single company or by different companies that specialize in a particular area. This further increases the complexity of producing ICs, as companies and their customers may be separated geographically, possibly in different time zones, making effective communication more difficult. For example, a first company (e.g., an IC design house) may design a new IC, a second company (e.g., an IC foundry) may provide the processing facilities used to fabricate the design, and a third company may assemble and test the fabricated IC. A fourth company may manage the overall manufacturing of the IC, including coordination of the design, processing, assembly, and testing operations.

Nitrogen and other inert gases are widely used to prevent oxidation of wafers during manufacturing. For example, nitrogen purge processing is often performed during 300 mm and deep submicron IC manufacturing. Typical nitrogen purge processing involves manual handling and non-systematic control of production wafers and equipment and, therefore, encounters problems with low efficiency, contamination and inconsistency, especially with larger wafer sizes, including 300 mm wafers and larger.

Accordingly, what is needed is a system and method that addresses the issues discussed above.

BRIEF DESCRIPTION OF THE DRAWINGS

FIG. 8 illustrates a flow chart of another embodiment of a method of implementing automatic gas purge according to aspects of the present disclosure.

DETAILED DESCRIPTION

Figure 1:
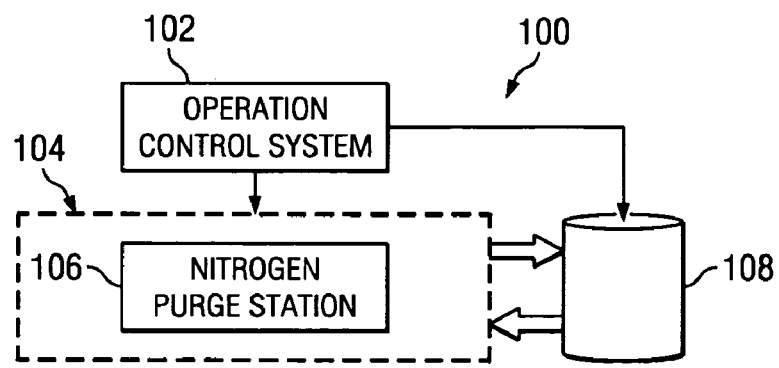
FIG. 1 illustrates a schematic view of one embodiment of an IC manufacturing system having automatic gas purge constructed according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a schematic view of one embodiment of an IC manufacturing system 100 having automatic nitrogen purge processing constructed according to aspects of the present disclosure. While described in terms of automatic nitrogen purge processing, aspects of the present disclosure are applicable and/or readily adaptable to performing gas purge processing with gases other than or in addition to nitrogen. The IC manufacturing system 100 may comprise an operation control system 102, an intermediate process chamber 104 and a nitrogen purge station 106.

The operation control system 102 may be a material control system (MCS). An MCS is a collection of hardware and software that coordinates the movement of materials between equipment. This coordination may occur at the following two levels in a factory: interbay level (from one process bay to another); and intrabay level (within one process bay). The MCS may control material handling and transportation in automation.

In one embodiment, the operating control system 102 may be a manufacturing execution system (MES). An MES is an online, integrated, computerized system that is the accumulation of the methods and tools used to accomplish production. The MES may include collecting data in real time, organizing and storing the data in a centralized database, work order management, workstation management, process management, inventory tracking, and document control. Examples of MES systems include Promis™ (a product of Brooks Automation Inc. of Massachusetts), Workstream™ (a product of Applied Materials, Inc. of California), Poseidon™ (a product of IBM Corporation of New York), and Mirl-MES™ (a product of Mechanical Industry Research Laboratories of Taiwan). Each MES may have a different application area. For example, Mirl-MES may be employed in applications involving packaging, liquid crystal displays (LCDs) and printed circuit boards (PCBs), while Promis, Workstream, Poseidon and SiView may be employed for IC fabrication and thin film transistor LCD (TFT-LCD) applications. The MES may include process information such as process step sequences for one or more products. An MCS and an MES may also be employed in combination. For example, an MES may coordinate manufacturing processes and an MCS may coordinate material handling.

The process intermediate chamber 104 may be an intermediate chamber in a process cluster tool. Such an intermediate chamber may include a loadlock or transfer chamber. The process cluster tool may be a sputtering tool, a chemical vapor deposition (CVD) tool, a rapid thermal process (RTP) tool, or a thermal furnace. The process intermediate chamber 104 may also be a stocker employed to store carriers of one or more wafer lots between manufacturing processes or stations. The process intermediate chamber 104 may also be an overhead buffer (OHB) which functions as an intermediate location for holding carriers in carrier transportation. For example, 200 mm wafers may employ standard mechanical interface (SMIF) pods, and 300 mm wafers may employ front opening unified pod (FOUP). SMIF or FOUP are employed during lot transportation to control contamination and as an automation interface. For example, the workpiece may be a FOUP with one or more 300 mm wafers inside.

The nitrogen purge station 106 may be a device having an automatic control and operation for nitrogen purge. The nitrogen purge station 106 may include a container, electric unit, temperature control, nitrogen supplier and exhaust. The nitrogen purge station 106 may be incorporated into a stocker, an OHB in an automatic material handling system (AMHS) or other systems, or a loadlock or transfer chamber of a cluster tool.

The operation control system 102 and the intermediate process chamber 104 may be linked to at least one database 108. The database 108 may comprise manufacturing data such as information regarding the nitrogen purge stations, lots in queue for nitrogen purge, work in process (WIP), and other nitrogen-purge related data. The whole or a fraction of the database 108 may be part of the MES, and may be included in the operation control system 102.

Figure 2:
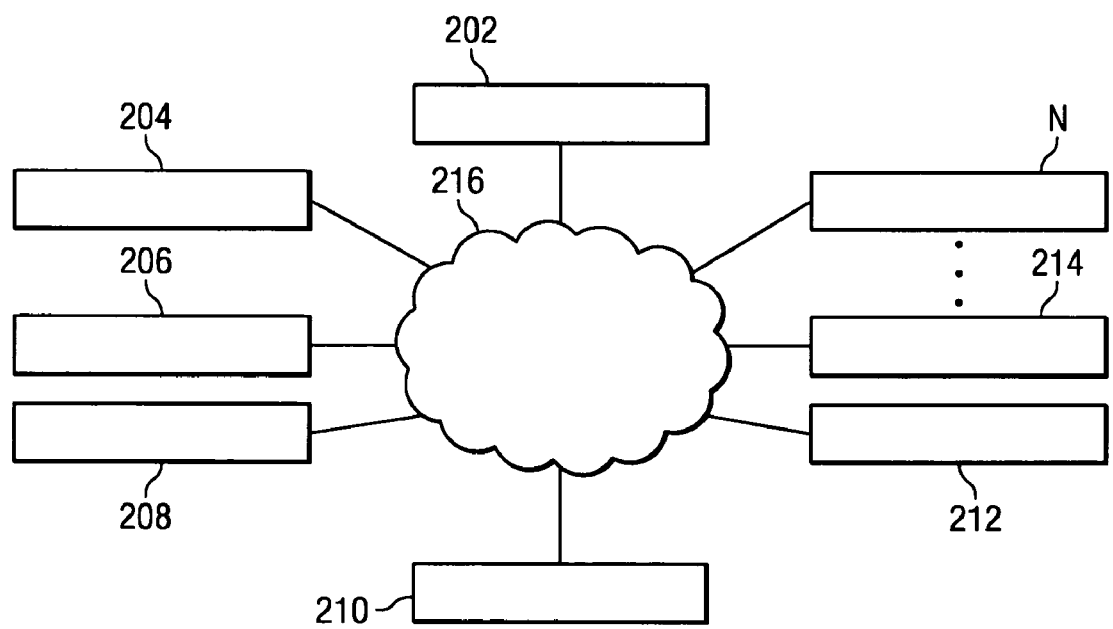
FIG. 2 illustrates a block diagram of another embodiment of an IC manufacturing system constructed according to aspects of the present disclosure.

Referring to FIG. 2, illustrated is another embodiment of an IC manufacturing system 200 constructed according to aspects of the present disclosure. The IC manufacturing system 200 is one environment in which the IC manufacturing system 100 shown in FIG. 1 may be implemented. The IC manufacturing system 200 includes a plurality of entities 202, 204, 206, 208, 210, 212, 214, . . . , N that are connected by a communications network 216. The network 216 may be a single network or a variety of different networks, such as an intranet and the Internet, and may include both wireline and wireless communication channels.

In the illustrated embodiment, the entity 202 represents a control system for manufacturing control, collaboration, and provision, the entity 204 represents a client, the entity 206 represents an engineer or an operator, the entity 208 represents a design/laboratory (lab) facility for IC design and testing, the entity 210 represents a fabrication (fab) facility, and the entity 212 represents a process (e.g., an automated fabrication process). The entity 214 represents another IC manufacturing system (e.g., an IC manufacturing system belonging to a subsidiary or a business partner). Each entity 202–214 may interact with other entities and may provide services to and/or receive services from the other entities.

It is understood that the entities 202–212 may be co-located at a single location or may be distributed, and that some entities may be incorporated into other entities. In addition, each entity 202–212 may be associated with system identification information that allows access to information within the system to be controlled based upon authority levels associated with identification information within each entity.

The IC manufacturing system 200 enables interaction among the entities 202–212 for the purpose of IC manufacturing, as well as the provision of services. For example, IC manufacturing may include design, fabrication, testing and shipping of the ICs.

One of the services provided by the IC manufacturing system 200 may enable collaboration and information access in such areas as design, engineering, and logistics. For example, in the engineering area, the engineer 206 may be given access to information and tools related to the processing of work-in-process (WIP) via the control system 202. The tools may enable the engineer 206 to perform yield enhancement analyses such as by viewing WIP inventory, machine down status, hold lots, and scrap information. The engineer 206 may collaborate with other engineers using fabrication information regarding pilot yield runs, risk analysis, quality, and reliability. The logistics area may provide the engineer 206 with process control, recipe download and upload, fabrication status, fabrication data collection, and testing results. It is understood that these areas are exemplary, and that more or less information may be made available via the IC manufacturing system 200 as desired.

Another service provided by the IC manufacturing system 200 may integrate systems between facilities, such as between the design/lab facility 208 and the fab facility 210. Such integration enables facilities to coordinate their activities. For example, integrating the design/lab facility 208 and the fab facility 210 may enable design information to be incorporated more efficiently into the fabrication process, and may enable data from the fabrication process to be returned to the design/lab facility 210 for evaluation and incorporation into later versions of an IC. The process 212 may represent any process operating within the IC manufacturing system 200. Client 204 could represent any party who has been granted privilege to access and manage IC manufacturing in a certain level from outside of the manufacturing fab, such as a customer, IC design engineer or process engineer in a remote location.

Figure 3:
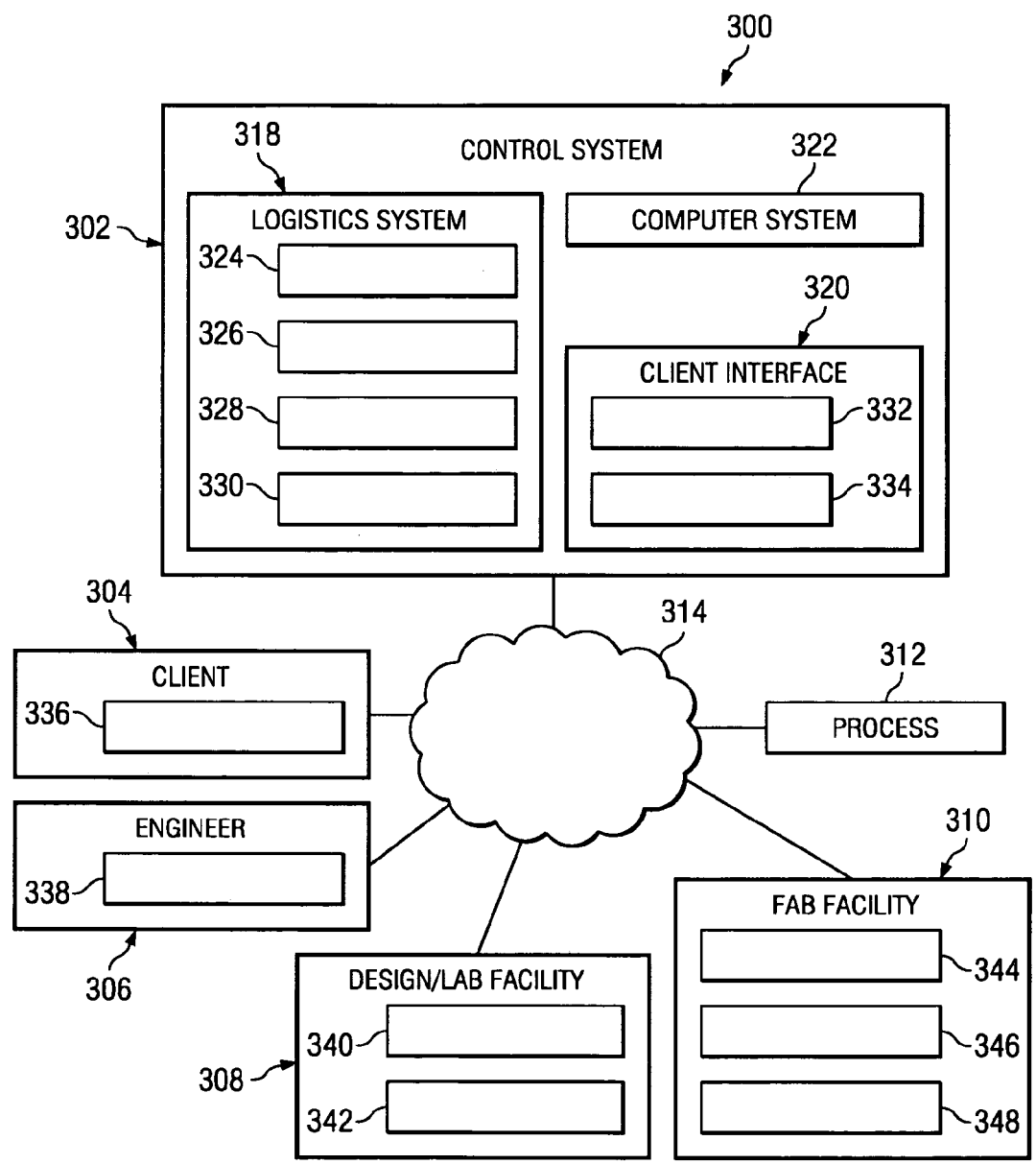
FIG. 3 illustrates a block diagram of another embodiment of an IC manufacturing system constructed according to aspects of the present disclosure.

Referring to FIG. 3, illustrated is another embodiment of an IC manufacturing system 300 constructed according to aspects of the present disclosure. The IC manufacturing system 300 is one environment in which the IC manufacturing system 200 of FIG. 2 may be implemented. The IC fabrication system 300 includes a plurality of entities 302, 304, 306, 308, 310, and 312 that are connected by a communications network 314. In the illustrated embodiment, the entity 302 represents a control system, the entity 304 represents a client, the entity 306 represents an engineer or operator, the entity 308 represents a design/lab facility for IC design and testing, the entity 310 represents a fab facility, and the entity 312 represents a process (e.g., an automated fabrication process). Each entity may interact with other entities and may provide services to and/or receive services from the other entities.

The control system 302 controls IC manufacturing operations and provides an interface between the engineer and the manufacturing. For example, the control system 302 may include a logistics system 318, a computer system 322, and a client interface 320 for enabling clients to directly access various aspects of manufacturing.

The logistics system 318 may include a work-in-process (WIP) system 324, a product data management system 326, an MCS 328, and an MES 330. The WIP system 324 may track working lots using a database. The product data management system 326 may manage product data and maintain a product database. The product database may include product categories (e.g., parts, part numbers, and associated information), as well as a set of process stages that are associated with each category of products. The MCS 328 may control material handling and transportation in automation. The logistics system may be extended to include other systems such as reticle field layout (RFL), order management system, and real time dispatching (RTD). The MES 330 may be connected to other systems both within the service system 302 and outside of the service system 302. The MES 330 may include information such as a process step sequence for one or more products.

The client interface 320 may include an online system 332 and a client management system 334. The online system 332 may function as an interface to communicate with client, and other systems within the service system 302, supporting databases, and other entities 306–312. The client management system 334 may manage client information and control, and may be supported by a plurality of databases to maintain client associated information.

Portions of the control system 302, such as the customer interface 320, may be associated with a computer system 322 or may have their own computer systems. In some embodiments, the computer system 322 may include multiple computers (FIG. 4), some of which may operate as servers to provide services to the customer 304 or other entities. The service system 302 may also provide such services as identification validation and access control to prevent unauthorized users from accessing data and to ensure that an authorized customer can access only their own data.

The client 304 may have direct control over associated production and processing via the IC fabrication system 300 using a computer system 336. In the present example, the client 304 may access the various entities 302, 306–312 of the IC manufacturing system 300 through the customer interface 320 provided by the control system 302. However, in some situations, it may be desirable to enable the client 304 to access other entities without going through the client interface 320. For example, the client 304 may directly access the fab facility 310 to obtain fabrication related data.

The engineer 306 may collaborate in the IC manufacturing process with other entities of the IC fabrication system 300 using a computer system 338. The IC manufacturing system 300 enables the engineer 306 to collaborate with other engineers and the design/lab facility 308 in IC design and testing, to monitor fabrication processes at the fab facility 310, and to obtain information regarding test runs, yields, etc. In some embodiments, the engineer 306 may communicate directly with the client 304 via the client interface 320 to address design issues and other concerns.

The design/lab facility 308 provides IC design and testing services that may be accessed by other entities via the IC manufacturing system 300. The design/lab facility 308 may include a computer system 340 and various IC design and testing tools 342. The IC design and testing tools 342 may include both software and hardware.

The fab facility 310 enables the fabrication of ICs. Control of various aspects of the fabrication process, as well as data collected during the fabrication process, may be accessed via the IC fabrication system 300. The fab facility 310 may include a computer system 344, various processing/test tools 346 and various transport/stock equipment 348. For example, processing and test tools 346 may include ion implantation tools, chemical vapor deposition tools, thermal oxidation tools, sputtering tools, various optical imaging systems, residual gas analysis (RGA) apparatus, and various probe stations, as well as the software needed to control these components. The transport and stock equipment 348 may include a stocker, an overhead shuttle (OHS), an overhead transport (OHT), an OHB, a rail guided vehicle (RGV), an automatic guided vehicle (AGV), an FOUJP, an open cassette (OC), combinations thereof and/or other process intermediate chambers.

The process 312 may represent any process or operation that occurs within the IC fabrication system 300. For example, the process 312 may be an order process that receives an IC order from the client 304 via the control system 302, a fabrication process that runs within the fab facility 310, a design process executed by the engineer 306 using the design/lab facility 308, or a communications protocol that facilities communications between the various entities 302–312.

It is understood that the entities 302–312 of the IC manufacturing system 300, as well as their described interconnections, are for purposes of illustration only. For example, it is envisioned that more or fewer entities, both internal and external, may exist within the IC manufacturing system 300, and that some entities may be incorporated into other entities or distributed. For example, the control system 302 may be distributed among the various entities 306–310.

Figure 4:
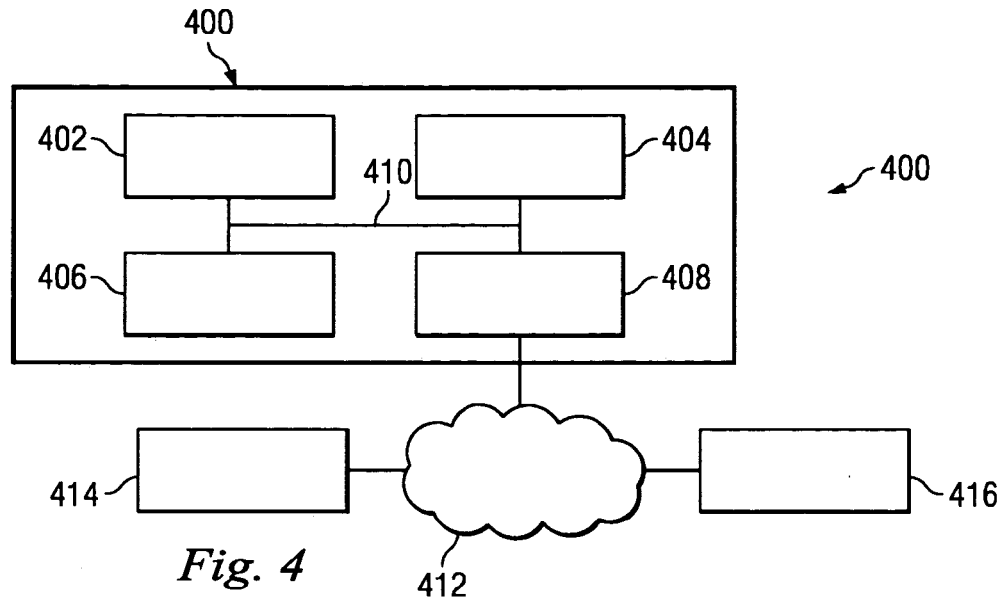
FIG. 4 illustrates a block diagram of one embodiment of a computer employed within an IC manufacturing system constructed according to aspects of the present disclosure.

Referring to FIG. 4, illustrated is one embodiment of a computer 400 employed within the IC manufacturing system 200 of FIG. 2 or the IC manufacturing system 300 of FIG. 3 according to aspects of the present disclosure. The computer 400 may include a central processing unit (CPU) 402, a memory unit 404, an input/output (I/O) device 406, and a network interface 408. The network interface 408 may be, for example, one or more network interface cards (NICs). The components 402, 404, 406, and 408 are interconnected by a bus system 410. It is understood that the computer may be differently configured and that each of the listed components may actually represent several different components. For example, the CPU 402 may actually represent a multi-processor or a distributed processing system; the memory unit 404 may include different levels of cache memory, main memory, hard disks, and remote storage locations; and the I/O device 406 may include one or more monitors, keyboards, and the like.

The computer 400 may be connected to a network 412, which may be connected to the networks 216 (FIG. 2) or 314 (FIG. 3). The network 412 may be, for example, a complete network or a subnet of a local area network, a company wide intranet, and/or the Internet. The computer 400 may be identified on the network 412 by an address or a combination of addresses, such as a media control access (MAC) address associated with the network interface 408 and an internet protocol (IP) address. Because the computer 400 may be connected to the network 412, certain components may, at times, be shared with other devices 414, 416. Therefore, a wide range of flexibility is anticipated in the configuration of the computer. Furthermore, it is understood that, in some implementations, the computer 400 may act as a server to other devices 414, 416. The devices 414, 416 may be computers, personal data assistants, wired or cellular telephones, or any other device able to communicate with the computer 400.

Figure 5:
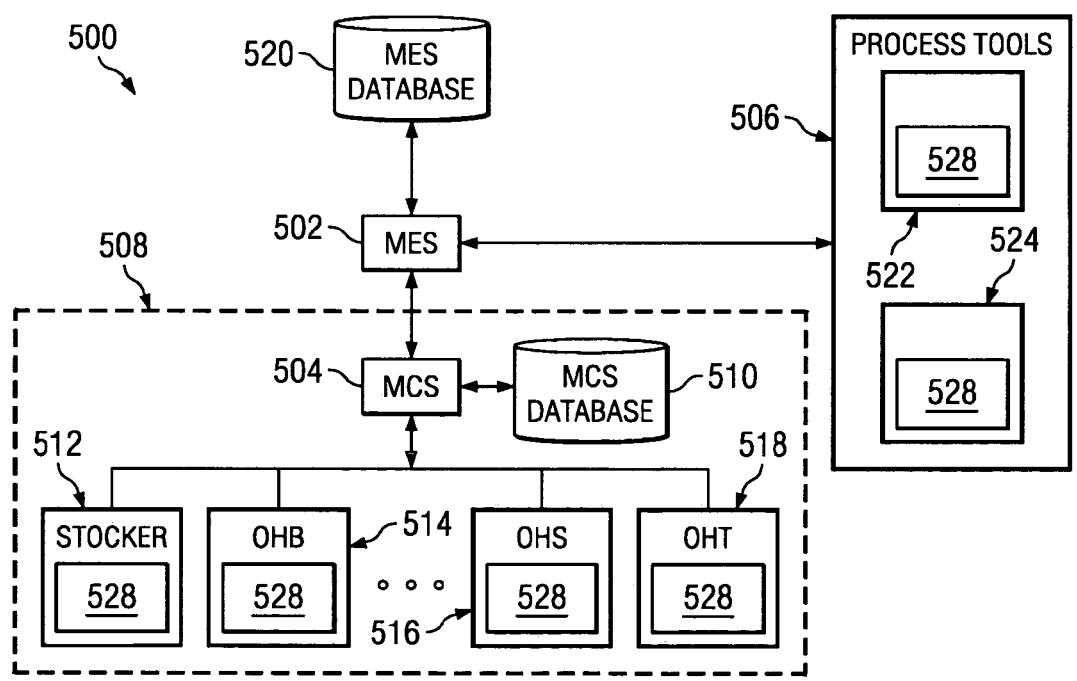
FIG. 5 illustrates a schematic view of another embodiment of an IC manufacturing system having automatic gas purge constructed according to aspects of the present disclosure.

Referring to FIG. 5, illustrated is a block diagram of another embodiment of a manufacturing system 500 to implement automatic nitrogen purge constructed according to aspects of the present disclosure. The system 500 may include an MES 502 and an MCS 504. The MES 502 may be connected to the MCS 504 with two-way communication and coordination. The MES 502 may send signals to the MCS 504 to control material such as transportation of workpieces (wafer lots or carriers containing wafer lots). The MES 502 may connect to a plurality of process tools 506 during manufacturing and control the process tools 506 for IC manufacturing and data collection.

The MCS 504 may be a portion of an AMHS 508. The AMHS 508 may include hardware to implement automatic material handling and software to control automatic material handling hardware. The control software may be MCS 504 in one example and its supporting database 510. The automatic material handling hardware may include a stocker 512, an OHB 514, an OHS 516, an OHT 518, a combination thereof and/or a combination of pluralities thereof. The stocker 512 may be a nitrogen stocker which is specifically designed for nitrogen purge processing, or an intermediate stocker for purging workpieces between processes. The OHB 514 functions as a buffer in FOUP transportation. The OHS 516 is an overhead rail guided transport system positioned for access to stocker automated interbay input and output ports. The OHT 518 is an overhead rail guided transport system positioned for vertical access. A nitrogen purge station or other nitrogen function 528 may be incorporated into an intermediate process chamber such as the stocker 512, the OHB 514, the loadlock 522, the transfer chamber 524, or a combination thereof.

The MCS 504 determines how material should get to its destination and manages such movement. The MCS 504 is supported by an MCS database 510 containing data such as time parameters of nitrogen purge processing, information regarding intermediate process chamber(s) configured for or including automatic nitrogen purge functionality, identification of workpieces undergoing and awaiting purge processing. Time parameters of nitrogen purge may include T1, T2, T3 and T4, which will be defined in FIG. 7. These parameters could also be passed by the MES 502. The MCS 504 may be controlled by the MES 502, or other systems, such as a factory control system (FCS), an operation job supervisor (OJS), and/or a real time dispatcher (RTD). The above systems may be incorporated together or run in parallel.

The MES 502 may send nitrogen purge processing commands to the MCS 504 and collect corresponding process data. The MCS 504 may control the transport of workpieces such as wafers in FOUP. The automatic material handling hardware may execute the transport and the nitrogen stocker may handle the nitrogen purge. All components in the system 500 may be connected to a network as in the IC fabrication system of FIG. 2 or in the IC fabrication system of FIG. 3. Purging may also be performed in inert gases other than nitrogen. The MES 502 may also have a plurality of databases 520, such as those containing information regarding WIP, process recipes, tool history, product routes, and statistical process controls (SPC).

The process tools 506 may be employed for CVD, PVD, RTP, ion implantation, etching, oxidation (e.g., a furnace), diffusion, lithography, chemical mechanical polishing (CMP), and/or testing. Each of the process tools 506 may also include a loadlock 522 and/or a transfer chamber 524.

Figure 6:
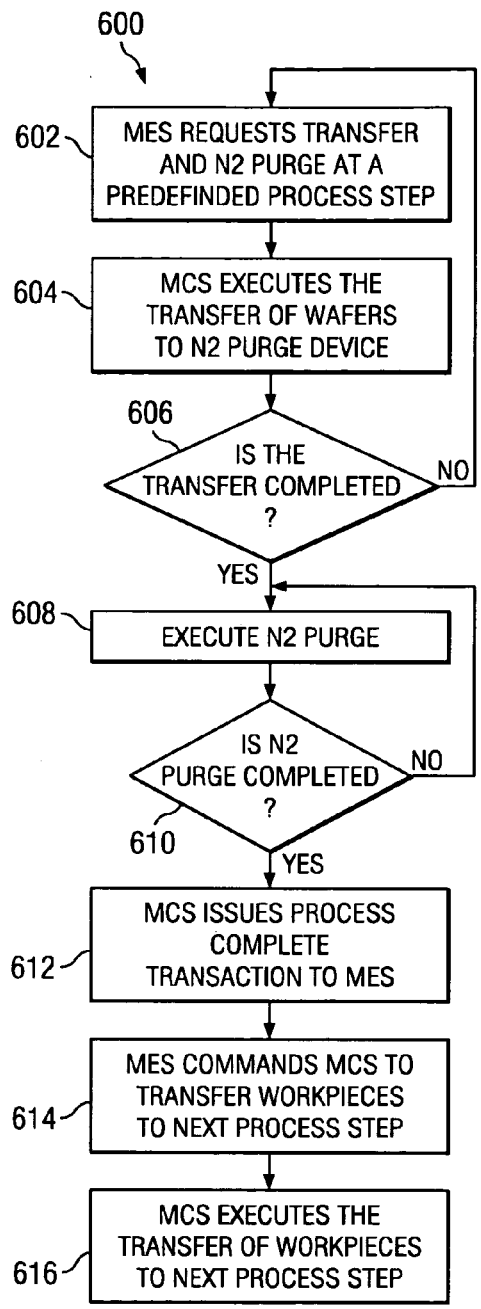
FIG. 6 illustrates a flow chart of one embodiment of one method of implementing automatic gas purge according to aspects of the present disclosure.

Referring to FIG. 6, illustrated is a flow chart of one embodiment of a method 600 to implement automatic nitrogen purge processing according to aspects of the present disclosure. The method 600 may be performed by or within the system 100 of FIG. 1.

The method 600 includes a step 602, in which an MES sends a command to an MCS to transfer workpieces to a nitrogen purge station and perform nitrogen purge processing. To implement step 602, all nitrogen purge processes and stations may be defined and incorporated into process routes in the MES for automation. In one embodiment, a fabrication recipe may include five process steps after which nitrogen purge processing is needed, although any number of nitrogen purge processing steps is within the scope of the present disclosure. For example, nitrogen purge processing may be required after photoresist (PR) wet stripping for metal patterning. Nitrogen purge processing may also be performed between the PR strip and a subsequent metal etch step. A nitrogen purge step may also be performed prior to Cu seeding, between Cu seeding and Cu plating, between Cu plating and metal one Cu CMP, and after metal one Cu CMP.

In a step 604, the MCS executes the workpiece transportation from the previous process step to a nitrogen purge device via an OHS, an OHT, and/or an OHB. In step 606, a process watchdog will determine if the workpiece transportation is completed. If transportation is not completed, the watchdog will trigger another command and step 602 will be repeated. Otherwise, a next step 608 in the method 600 will be performed.

In step 608, nitrogen purge processing is executed according to a recipe of predetermined parameters, such as time, temperature, and/or gas flow. In a step 610, the watchdog determines if the nitrogen purge has been completed. If the nitrogen purge has not been completed, then the watchdog will trigger another command for continued or repeated nitrogen purge processing and step 608 will be repeated. Otherwise, a next step 612 in the method 600 will be performed.

In step 612, the MCS issues a process transaction to the FCS. The transaction indicates that the nitrogen purge has been completed. In a subsequent step 614, the MES sends a command directing the MCS to transfer the workpieces to the next process step. In a subsequent step 616, the MCS controls transport of the workpieces from the nitrogen purge device to the next process step. This nitrogen purge process may be completed at this point.

In step 104, the MCS executes the command from the MES by two substeps: transferring the workpieces to the nitrogen purge device and nitrogen purging the workpiece in the nitrogen purge device. Transport of the workpieces may involve automatic material handling hardware which may include a nitrogen stocker, an overhead shuttle (OHS) and/or an overhead transport (OHT). The nitrogen purge may be implemented at a predetermined temperature, nitrogen gas flow, and/or time duration.

Figure 7:
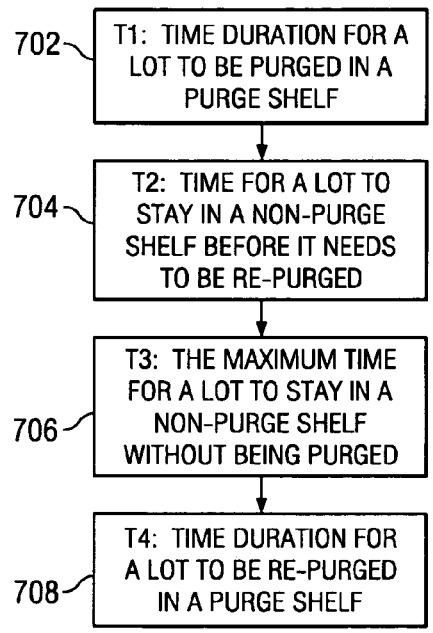
FIG. 7 illustrates a block diagram of one embodiment of time parameters of automatic gas purge according to aspects of the present disclosure.

Referring to FIG. 7, illustrated is a block diagram of one embodiment of time parameters of automatic nitrogen purge processing according to aspects of the present disclosure.

Four time parameters are defined below. Parameter 702 ("T1") is defined as a purging time duration for a lot undergoing nitrogen purge processing. Parameter 704 ("T2") is defined as the time duration for a lot to stay in a non-purge shelf before it needs to be re-purged. Parameter 706 ("T3") is defined as the maximum time for a lot to stay in a non-purge shelf without being purged. Parameter 708 ("T4") is defined as the re-purging time duration if a lot needs to be re-purged. Nitrogen purge time is T1; nitrogen re-purge time is T4; maximum shelf waiting time for nitrogen purge is T3; and shelf time wherein a re-purge is required is T2.

Referring to FIG. 8, illustrated is a flow chart of another embodiment of a method for automatic nitrogen purge constructed according to aspects of the present disclosure, with additional reference to FIG. 7 for time parameters. The disclosed method 800 will use predetermined time parameters T1 to T4 to control automatic nitrogen purge, using a stocker as the purge location, for example.

The method 800 begins at step 802 in which the workpiece ("lot A," for example) is transferred to and stored in a stocker ("stocker A"). In step 804, an operation control system such as MES and/or an MCS will determine if lot A needs nitrogen purge according to a process route database. If no nitrogen purge is required, lot A will follow a normal process procedure as in step 806. Otherwise, the method 800 will proceed to the next step 808 to determine if stocker A has nitrogen purge function. In step 810, the operation control system will transfer lot A to a stocker having a nitrogen purge station if the current stocker does not have a nitrogen purge station. The operation control system may optimize queue time according to its database of all nitrogen purge stations (stockers and others) and all workpieces awaiting nitrogen purge. The operation control system may ensure that the optimized queue time is less than T3 as defined in FIG. 7. In step 812, if stocker A has a nitrogen purge station, the operation control system will check if the purge station in stoker A is available. In step 814, lot A keeps waiting until the purge station in stocker A is available. In step 816, the operation control system checks lot A for a tag ID. The operation control system will raise a flag if lot A has no tag ID in step 822. The tag ID may contain information such as process history associated with this lot. Otherwise, the method 800 will proceed to step 818 to execute nitrogen purge processing. The operation control system may check and ensure the time of nitrogen purge is equal to or greater than T1 (or T4 if this process is nitrogen re-purging) in step 820. The method 800 then proceeds to step 824 in which the tag ID information is updated to reflect the nitrogen purge process. In step 826, the operation control system may determine if stocker A is the destination stocker after nitrogen processing is completed. In step 828, if stocker A is not destination stocker, the operation control system will coordinate and implement the transfer of lot A from stocker A to the proper destination. Otherwise, the operation control system will store lot A in a normal (non-purge) area of stocker A, waiting for next process in the process path. In step 830, the operation control system may check dwell time of lot A in stocker A. If the dwell time is longer than T2, lot A may undergo re-purging.

Thus, the present disclosure introduces a system for manufacturing semiconductor integrated circuit (IC) devices. In one embodiment, the system includes an operating control system, a process intermediate station in communication with the operating control system, and a gas purge device, wherein the gas purge device is included in the process intermediate station.

The present disclosure also introduces a method for automatic gas purge in manufacturing semiconductor IC devices. In one embodiment, the method includes transferring a workpiece to a process intermediate station having a gas purge station, performing gas purging of the workpiece, and transferring the workpiece to a next process, wherein the transfer of the workpiece to the process intermediate station and to the next process is performed via an operating control system.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A system for manufacturing semiconductor integrated circuit (IC) devices, the system comprising:
    an operating control system;
    a plurality of process tools each in communication with the operating control system;
    a process intermediate station in communication with the operating control system, wherein the process intermediate station is one of a stocker and an overhead buffer (OHB) that is not integral to any of the plurality of process tools; and
    a gas purge device, wherein the gas purge device is included in the process intermediate station.

2. The system of claim 1 wherein the operating control system is a material control system (MCS).

3. The system of claim 1 further comprising a manufacturing execution system (MES) connected to the operating control system.

4. The system of claim 3 wherein the MES comprises an operation job supervisor (OJS).

5. The system of claim 3 wherein the MES comprises a dispatcher.

6. The system of claim 1 wherein the process intermediate station is the stocker.

7. The system of claim 1 wherein the process intermediate station is the OHB.

8. The system of claim 1 wherein the process intermediate station is a first process intermediate station that is not integral to any of the plurality of process tools and the system further comprises a second process intermediate station that is not integral to any of the plurality of process tools, wherein the first process intermediate station is the stocker and the second process intermediate station is the OHB.

9. The system of claim 1 wherein the process intermediate station is one of at least two process intermediate stations that are each not integral to any of the plurality of process tools, wherein the gas purge device is one of a plurality of gas purge devices, and wherein each of the at least two process intermediate stations is one of a stocker including one of the plurality of gas purge devices and an OHB including one of the plurality of gas purge devices.

10. The system of claim 1 wherein the gas purge device uses nitrogen as purging gas.

11. A system for manufacturing semiconductor IC devices, the system comprising:
    an operating control system;
    a plurality of process tools each in communication with the operating control system;
    a plurality of process intermediate stations each in communication with the operating control system, wherein each of the plurality of process intermediate stations is one of a stocker and an overhead buffer (OHB) that is not integral to any of the plurality of process tools; and
    at least one gas purge device included in at least one of the plurality of process intermediate stations.

12. The system of claim 11 further comprising a manufacturing execution system (MES) connected to the operating control system.

13. The system of claim 11 wherein the MES includes a dispatcher.

14. The system of claim 13 wherein the dispatcher includes dispatching rules for dispatching a workpiece among processing equipment.

15. The system of claim 14 wherein dispatching the workpiece includes dispatching the workpiece among the plurality of process intermediate stations.

16. A method for automatic nitrogen purge processing in manufacturing semiconductor IC devices, comprising:
    transferring, via an operating control system, a workpiece from a first process tool to a process intermediate station, wherein the process intermediate station is one of a stocker and an overhead buffer (OHB) having a gas purge station;

performing gas purging of the workpiece via the gas purge station of the process intermediate station; and transferring, via the operating control system, the workpiece to a second process tool, wherein the process intermediate station is not integral to either of the first and second process tools.

17. The method of claim 16 wherein the operating control system is a manufacturing execution system (MES) configured to control transfer of the workpiece between the process intermediate station and the first and second process tools.

18. The method of claim 16 wherein the operating control system includes a material control system (MCS) configured to control transfer of the workpiece between the process intermediate station and the first and second process tools.

19. The method of claim 16 wherein the workpiece is a lot including a plurality of wafers.

20. The method of claim 16 wherein the workpiece has at least one wafer included in a front opening unified pod (FOUP).

21. The method of claim 16 wherein the process intermediate station is the stocker.

22. The method of claim 16 wherein the process intermediate station is the OHB.

23. The method of claim 16 wherein the gas purge station is one of a plurality of gas purge stations, the method further comprising selecting one of the plurality of gas purge stations to perform the gas purging based on an optimized gas purge queue time, wherein the process intermediate station to which the workpiece is subsequently transferred after the one of the plurality of gas purge stations is selected has the selected one of the plurality of gas purge stations.

24. The method of claim 16 further comprising updating a tag ID after gas purging is performed, wherein the tag ID contains process history information associated with the workpiece, and wherein updating the tag ID includes updating the process history information to reflect the performance of the gas purging.

25. The method of claim 16 further comprising performing gas re-purging if a shelf time after the gas purging is longer than a pre-determined time.

26. The method of claim 16 further comprising raising a flag for hold if the workpiece has no associated process history information available.

27. The method of claim 16 wherein the gas purging comprises nitrogen purging.

* * * * *